(12) United States Patent
Tam et al.

(10) Patent No.: US 8,311,752 B1
(45) Date of Patent: Nov. 13, 2012

(54) METHOD AND APPARATUS TO QUANTIFY MAST CLAMP CURRENT PROBE EFFECTIVE LOSS ON POLE-MAST ANTENNA

(75) Inventors: Daniel W. Tam, San Diego, CA (US);
Peder M. Hansen, San Diego, CA (US);
Daniel R. Gaytan, Chula Vista, CA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 286 days.

(21) Appl. No.: 12/909,560

(22) Filed: Oct. 21, 2010

(51) Int. Cl.
*G01R 15/00* (2006.01)
(52) U.S. Cl. ......................................................... 702/57
(58) Field of Classification Search .............. 702/57–62, 702/182–185
See application file for complete search history.

(56) References Cited

U.S. PATENT DOCUMENTS 8,050,740 B2 * 11/2011 Davis et al. ................... 600/430

* cited by examiner

*Primary Examiner* — Edward Raymond
(74) *Attorney, Agent, or Firm* — Kyle Eppele; J. Eric Anderson

(57) ABSTRACT

A method for quantifying the effective loss of a mast-clamp-current-probe (MCCP) antenna comprising the following steps: providing a vector network analyzer (VNA) having first and second ports (Ports 1 and 2 respectively); coupling a transmit monopole antenna to Port 1 via a first transmission line; coupling a receive antenna to Port 2 via a second transmission line; determining the S-parameters of the two coupled antennas; calculating the power at the receive antenna ($P_r$); converting the transmit antenna to the MCCP antenna by shorting the transmit antenna to ground and clamping a current probe around the transmit antenna; determining the S'-parameters of the MCCP antenna and the receive antenna; calculating the power at the receive antenna ($P_r'$) when coupled to the MCCP antenna; and quantifying the effective loss of the MCCP antenna as the difference $P_r - P_r'$.

10 Claims, 6 Drawing Sheets

METHOD AND APPARATUS TO QUANTIFY MAST CLAMP CURRENT PROBE EFFECTIVE LOSS ON POLE-MAST ANTENNA

FEDERALLY-SPONSORED RESEARCH AND DEVELOPMENT

This invention is assigned to the United States Government and is available for licensing for commercial purposes. Licensing and technical inquiries may be directed to the Office of Research and Technical Applications, Space and Naval Warfare Systems Center, Pacific, Code 72120, San Diego, Calif., 92152; voice (619) 553-2778; email T2@spawar.navy.mil. Reference Navy Case Number 100473.

BACKGROUND OF THE INVENTION

Mast Clamp Current Probe (MCCP) technology offers a means to eliminate some of the traditional HF antennas in locations where available real estate for antenna placement is limited, such as building rooftops and ships. In the case of ships, MCCP antennas can utilize parts of the shipboard structure as the antenna element for receive and transmit functions. There exists a need for a method for quantifying the attenuation, or effective loss, of a MCCP antenna.

SUMMARY

Disclosed herein is a method for quantifying the effective loss of a mast-clamp-current-probe (MCCP) antenna comprising the following steps: providing a vector network analyzer (VNA) having first and second ports (Ports 1 and 2 respectively); coupling a transmit monopole antenna to Port 1 via a first transmission line; coupling a receive antenna to Port 2 via a second transmission line; determining the S-parameters of the two coupled antennas; calculating the power at the receive antenna ($P_r$); converting the transmit antenna to the MCCP antenna by shorting the transmit antenna to ground and clamping a current probe around the transmit antenna; determining the S'-parameters of the MCCP antenna and the receive antenna; calculating the power at the receive antenna ($P_r'$) when coupled to the MCCP antenna; and quantifying the effective loss of the MCCP antenna as the difference $P_r - P_r'$.

BRIEF DESCRIPTION OF THE DRAWINGS

Throughout the several views, like elements are referenced using like references. The elements in the figures are not drawn to scale and some dimensions are exaggerated for clarity.

DETAILED DESCRIPTION OF EMBODIMENTS

Figure 1A:
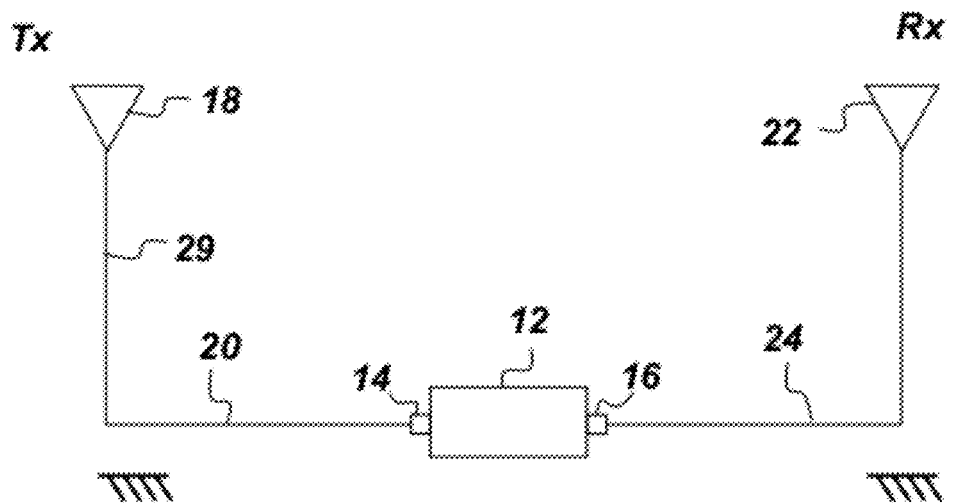
FIGS. 1a and 1b are block diagrams showing the components needed to conduct a method for quantifying the effective loss of a Mast Clamp Current Probe (MCCP) antenna.
Figure 1B:
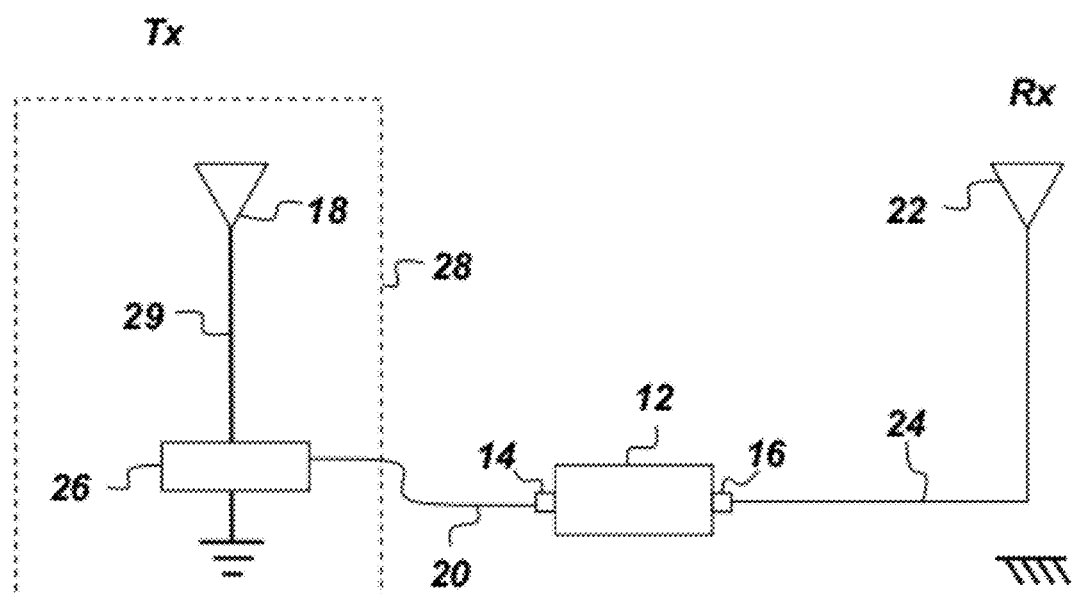
Figure 2:
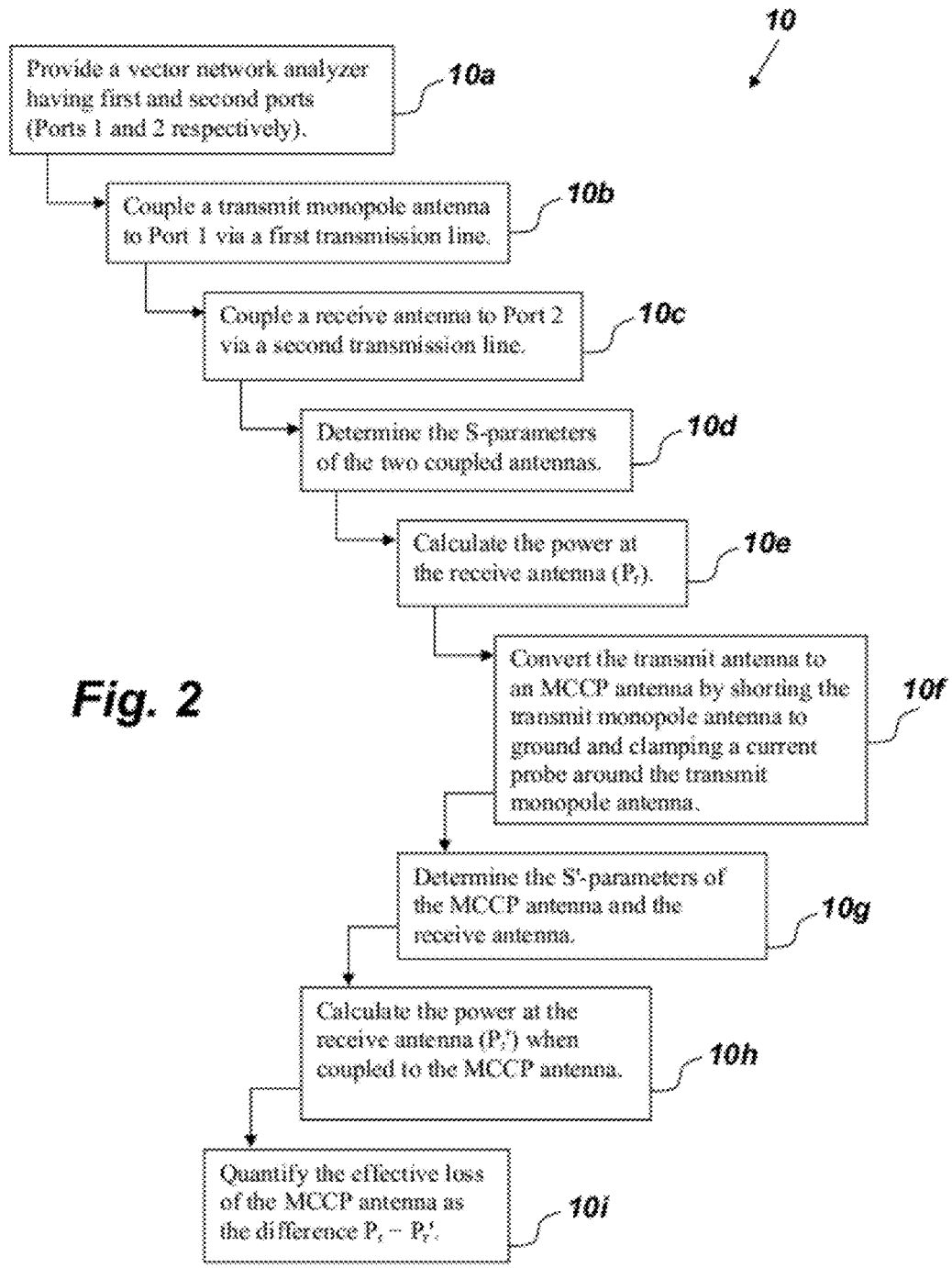
FIG. 2 is a flowchart illustrating a method for quantifying the effective loss of an MCCP antenna.

FIGS. 1a and 1b are block diagrams showing the components needed to conduct a method 10 (as depicted in FIG. 2) for quantifying the effective loss of a Mast Clamp Current Probe (MCCP) antenna. FIG. 2 is a flowchart which shows the individual steps of method 10. The first step of method 10, step 10a, calls for providing a vector network analyzer (VNA) 12 having a first port 14 and a second port 16. Step 10b provides for coupling a transmit monopole antenna 18 to the first port 14 via a first transmission line 20. Step 10c provides for coupling a receive antenna 22 to the second port 16 via a second transmission line 24. Step 10d provides for determining the S-parameters of the two coupled antennas 18 and 22. The next step, step 10e, provides for calculating the power at the receive antenna ($P_r$). Step 10f provides for shorting the transmit antenna 18 to ground and clamping a current probe 26 around the transmit antenna 18—thus converting the transmit antenna 18 into an MCCP antenna 28. Then, the S'-parameters of the two coupled antennas 28 and 22 is determined in step 10g. Step 10h provides for calculating the power ($P_r'$) at the receive antenna 22 when coupled to the MCCP antenna 28. Step 10i provides for quantifying the effective loss of the MCCP antenna 28 as the difference $P_r - P_r'$.

The VNA 12 may be any vector network analyzer or performance network analyzer (PNA) that has at least two ports and is capable of measuring both the amplitude and phase properties of a device under test. For example, a suitable VNA 12 is a model 8753ES, 2-port VNA made by Agilent Technologies. Monopole and dipole antenna designs may be used for the receive antenna 22.

Any desired frequency may be used with method 10, depending on the VNA/PNA frequencies range and the MCCP antenna 28 desired to be tested. Any size of current probe 26 can be used as long as the inside diameter aperture of the current probe 26 is large enough to accommodate the pole mast 29 of the transmit monopole antenna 18. The size of current probe 26 depends on the outer diameter of the pole mast 29 under test. The impedance of the MCCP antenna 28 is a function of the current probe 26 attachment point. The current probe 26 may be clamped near the base of the transmit monopole antenna 18 pole mast 29 to create a monopole MCCP antenna 28. For example, in one embodiment, the current probe 26 may be clamped approximately 15.25 cm (6 in) from the base of the transmit monopole antenna 18 pole mast 29. Current probes 26 having more that one port may also be used with method 10—in such cases, the unused port(s) may be terminated with a 50 ohm load.

A suitable example of the first and second transmission lines 20 and 24 is shielded co-axial cable. The length of the first and second transmission lines 20 and 24 may be any desired length. For example, the first and second transmission lines 20 and 24 may both be approximately 18.3 meters (60 ft) in length. The length of first and second transmission lines 20 and 24 depend on whether the analyzer being used in the test can calibrate a particular cable length. Cables can be of different lengths so long as they are calibrated with the analyzer prior to the S-parameter test.

Figure 3A:
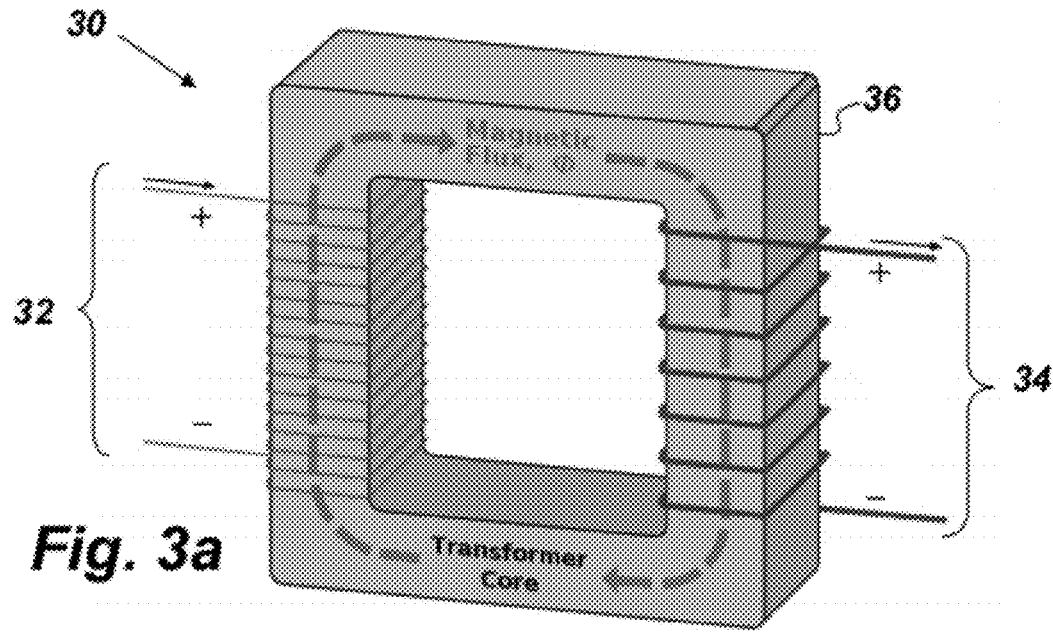
FIGS. 3a-3b are graphic illustrations comparing a traditional transformer to an MCCP antenna.
Figure 3B:
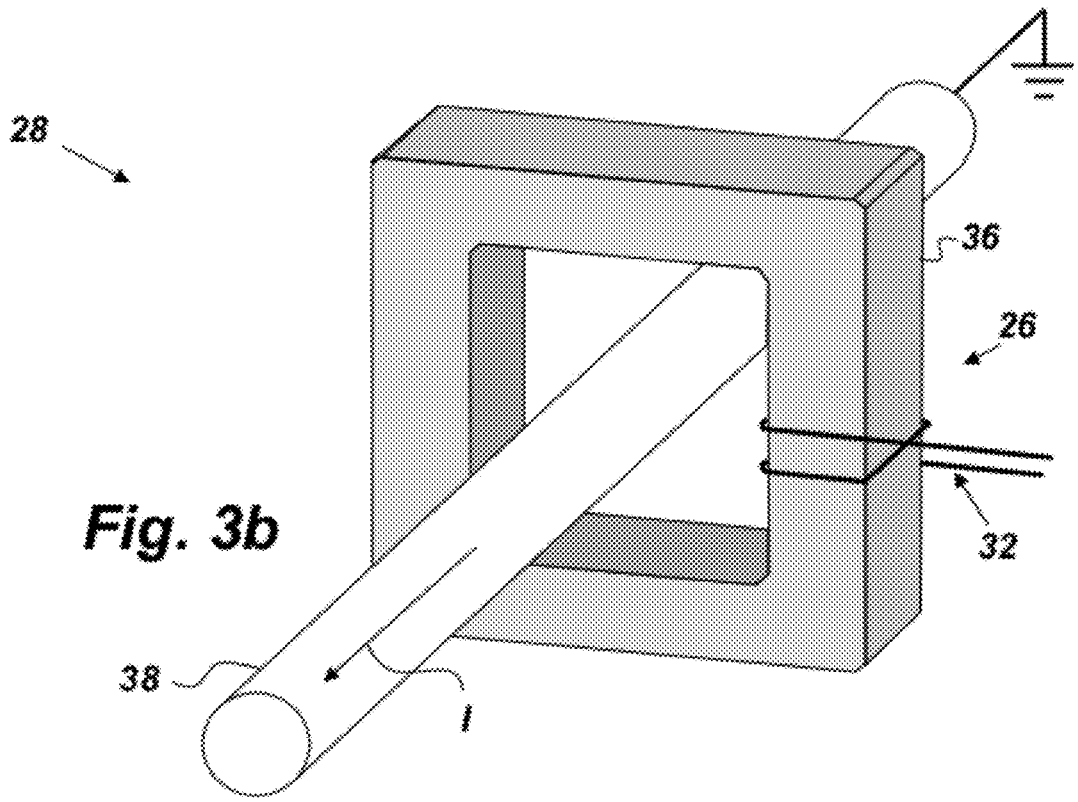

The MCCP antenna 28 is essentially a specially designed wideband RF current transformer that inductively or magnetically couples energy from a transmitter output signal voltage to a structure (e.g. the superstructure of a ship) for antenna communication. FIG. 3a is an illustration of a basic transformer 30. The transformer 30 comprises a primary winding 32, a secondary winding 34, and a magnetic core 36. The transformer 30 works on Faraday's law of induction principle of sharing common magnetic flux in the core 36 to transfer the electric energy from one winding to the other. FIG. 3b is a simple illustration of an MCCP antenna 28. The current probe 26 also has a magnetic core 36 and a primary winding 32. The electromagnetism principle of the MCCP antenna 28 is that a varying magnetic field generated in the magnetic core 36 induces a current I into an open-ended conductive structure 38, which acts as the antenna element. The conductive structure 38 may be an existing antenna pole, such as the pole mast 29, the superstructure of a ship, or any other desired conductor that fits inside the center aperture of the current probe 26. The primary winding 32 of the current probe 26 has a coil of wire wrapped around the magnetic core 36. The close-ended or grounded-end superstructure 38 passing through the magnetic core 36 forms a coil of wire for the secondary winding. Maximum coupling energy transfer is obtained with a high permeability core minimizing flux leakage and core loss. Permeability is a measure of how well the current probe core material conducts or guides a magnetic field.

Faraday's law of induction formalized the interrelationship between electromotive force (EMF) or "voltage" and magnetic flux in the following equation:

$$|E| = \left|\frac{\partial \Phi_B}{\partial t}\right|$$

where
E=EMF in volts
$\Phi_B$=magnetic flux in webers

The MCCP antenna 28 is an electromagnetic energy transducer much like the transformer 30. In both cases, electrical energy fed into the primary winding 32 is magnetically coupled into the core 36, which in turns couples the energy into the secondary winding 34. In the case of the transformer 30, the secondary winding 34 delivers this energy to a load. But in the MCCP antenna 28, the conductive structure 38 (i.e. the secondary winding) radiates this energy into space. Operationally, the quantities of interest of the MCCP pole-mast antenna 28 are bandwidth, attenuation, pole-mast impedance, and radiation efficiency. Bandwidth specifies the operational frequency range of the MCCP antenna 28. This range is directly related to the reflection (input VSWR) of the MCCP antenna 28. Attenuation specifies the signal loss as it propagates through the MCCP antenna 28.

Figure 4:
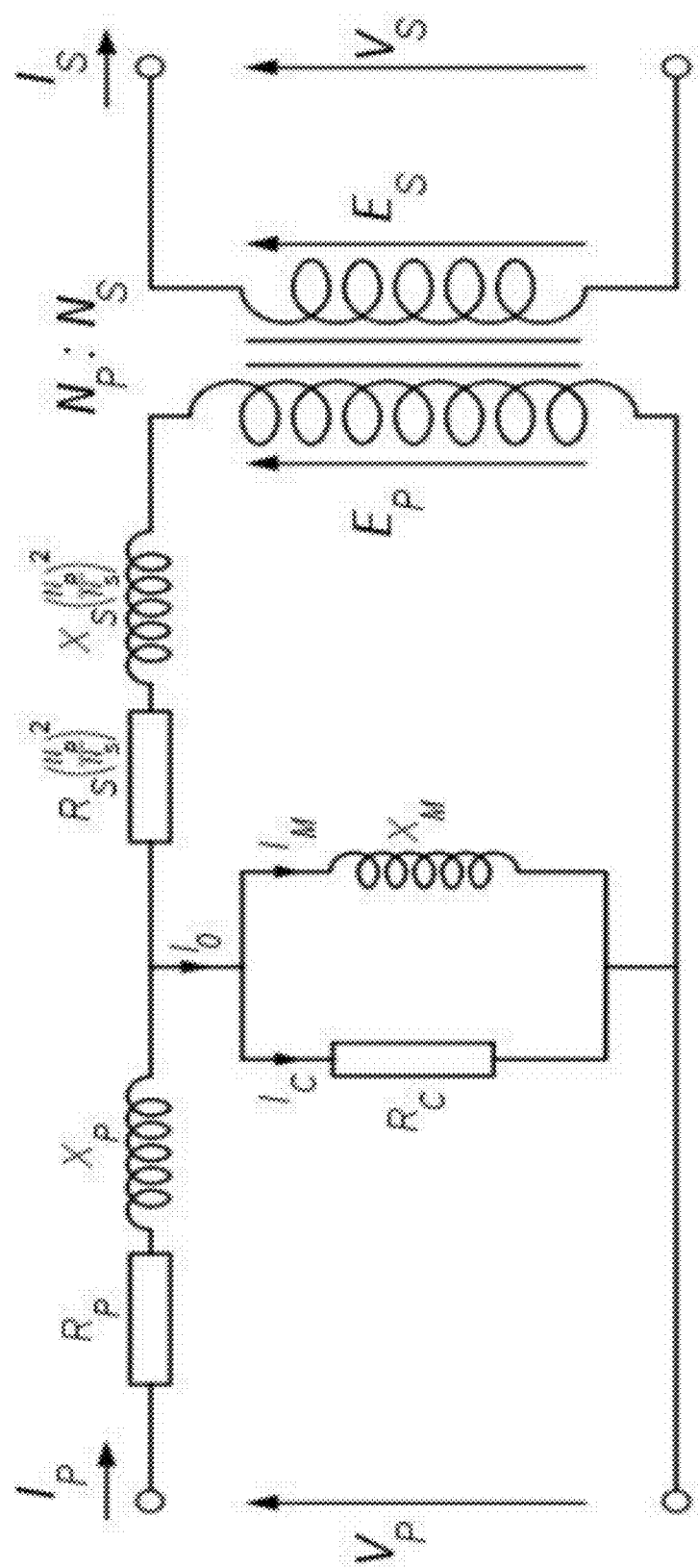
FIG. 4 is a circuit diagram for a transformer.

FIG. 4 is a circuit diagram of a transformer model. The first port 14 may be thought of as the primary winding 32 of the current probe 26. In which case, the transformed normalized input feed-point impedance is then the internal impedance of the current probe 26 together with the reflected transmit monopole antenna 18 mast pole impedance from the secondary winding 34. The physical quantity being transformed in this case is suggested by the transformer model shown in FIG. 4. The transformer has $N_P$ turns in the primary winding, $N_S$ in the secondary. The reference characters shown in FIG. 4 may be defined as follows:

$R_P$=Primary winding resistance
$X_P$=Primary leakage reactance
$R_S$=Secondary winding resistance
$X_S$=Secondary leakage reactance
$R_C$=Core loss equivalent resistance
$X_M$=Magnetizing reactance
$V_P$=Primary winding voltage
$I_P$=Primary winding current
$V_S$=Secondary winding voltage
$I_S$=Secondary winding current
$E_P$=Electromotive force of the primary winding
$E_S$=Electromotive force of the secondary winding
$I_C$=Current into $R_C$
$I_M$=Magnetizing current into $X_M$
$I_0$=No load current In the above electrical model, the secondary winding resistance $R_S$ and the secondary leakage reactance $X_S$ have been reflected to the primary circuit by the turns ratio squared. For the MCCP antenna 28, the turns ratio is approximately unity (because both primary and secondary windings have about one turn of coil, i.e. $N_P \sim N_S$). When the current probe 26 encloses an open-ended structure, the magnetic energy couples into the structure; thus forming a half-turn coil pathway for the RF energy.

Direct measurement of the effective loss of the current probe 26 on the transmit monopole antenna 18 can be deduced from the measurable scattering parameters or S-parameters using two antenna coupling techniques. S-parameters describe the signal voltage flow in a terminated network. To measure the S-parameters for the two antenna systems, the VNA 12 is used. The S-parameters produced by the VNA 12 have the following meaning:

$S_{11}$=Reflected signal ratio at the first port
$S_{12}$=Transmitted signal ratio from the second port to the first port
$S_{21}$=Transmitted signal ratio from the first port to the second port
$S_{22}$=Reflected signal ratio at the second port Or, stated another way:
$S_{11}$=the ratio of a reflected signal at the first port to an incident signal at the first port,
$S_{12}$=the ratio of a measured signal at the first port to an incident signal at the second port,
$S_{21}$=the ratio of a measured signal at the second port to the incident signal at first port,
$S_{22}$=the ratio of a reflected signal at the second port to the incident signal at the second port;

The total system power gain or attenuation can be related to the S-parameters. To uncover the effective loss due to the current probe 26, a two antennas coupling reference system, such as is depicted in FIGS. 5a and 5b, may be used.

Figure 5A:
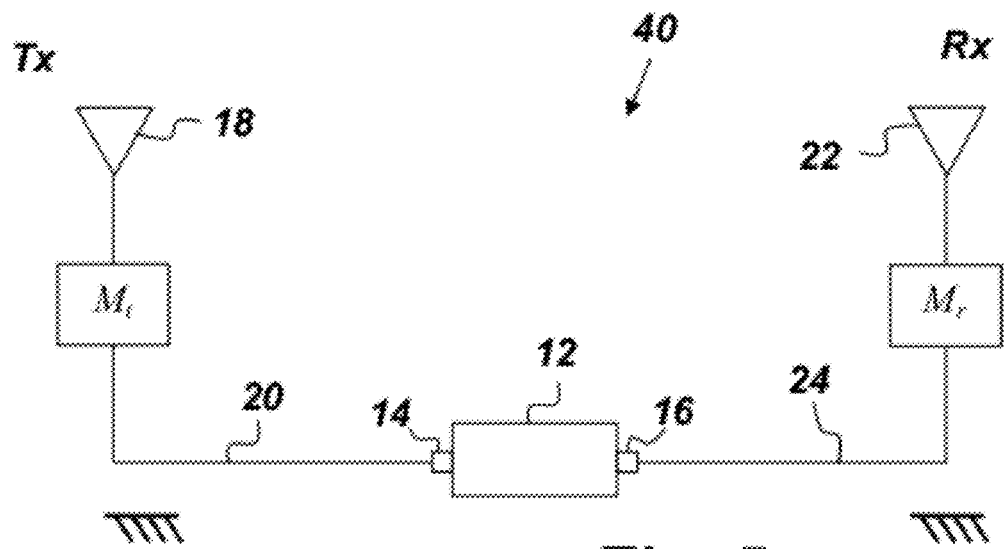
FIGS. 5a-5b are block diagrams of a reference two-antenna system and an MCCP test system.
Figure 5B:
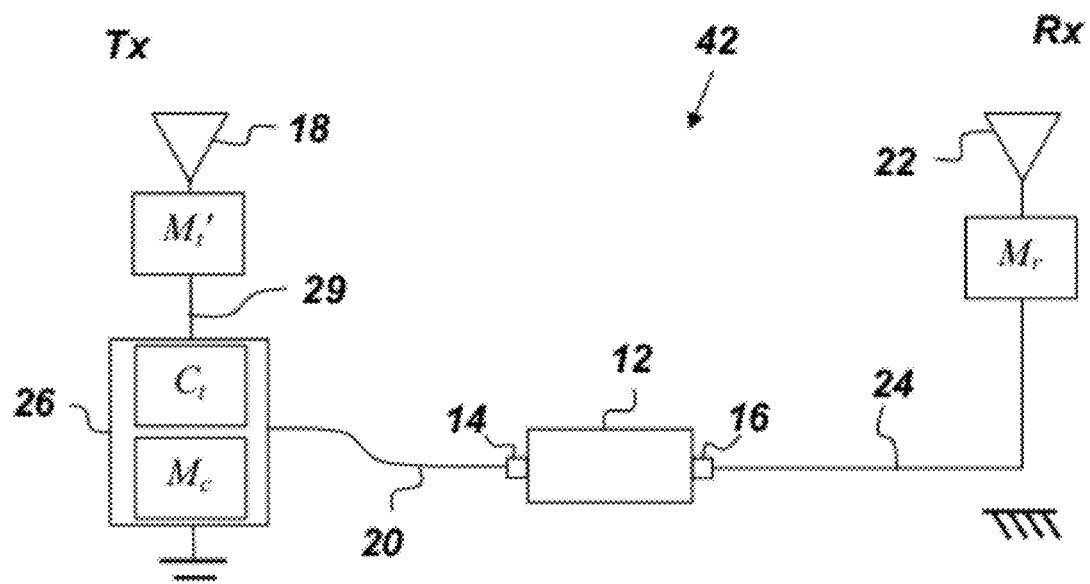

FIG. 5a is a block diagram representing a reference system 40 which comprises the transmit monopole antenna 18 coupled to the receive antenna 22 via the VNA 12. The mismatch loss $M_t$ of the transmit monopole antenna 18 is the reflected signal ratio at the first port 14, (i.e. $S_{11}$). The mismatch loss $M_r$ of the receive antenna 22 is the reflected signal ratio at the second port 16 (i.e. $S_{22}$). In the reference system 40, the power at the receiver ($P_r$) is given by:

$$P_r = P_t - M_t + (G_t - S + G_r) - M_r$$

where
$P_r$=Received power=$s_{12}$
$P_t$=Transmitted power
$M_t$=Transmit antenna mismatch loss=$s_{11}$
$G_t$=Transmit antenna gain
S=Space loss
$G_r$=Receive antenna gain
$M_r$=Receive antenna mismatch loss=$s_{22}$ FIG. 5b is a block diagram representing a test system 42 which differs from the reference system 40 in that the current probe 26 is attached to the transmit monopole antenna 18 pole mast 29, thus creating an MCCP antenna 28. When the transmit MCCP antenna 28 is inserted into the transmission loop, the power at the receiver ($P_r'$) is given by:

$$P_r' = P_t - (M_c + C_t) - M_t'(G_t' - S + G_r) - M_r$$

where
$P_r'$=Received power=$s_{12}'$
$P_t$=Transmitted power
$M_c$=Mismatch loss (reflection loss) of the current probe core=$s_{11}'$ $C_t$=Current probe core loss (transmission loss)
$M_t'$=MCCP antenna mismatch loss
$G_t'$=MCCP antenna gain
$M_r$=Receive antenna mismatch loss=$s_{22}$ When using an identical transmit antenna, it is expected that: $G_r$==$G_t'$. However, in reality, the grounded base pole-mast and insulated base pole-mast antenna have slight differences in self-impedances and the insertion of the current probe 26 at the grounded base of the open-ended structure 38 further affects the pole-mast self impedance. If this compatibility is not satisfied, a matching network may be used. For similar current probe 26 and VNA 12 impedances, the following assumption is used: $M_r \cong M_t'$.

The attenuation of the MCCP antenna 28 is estimated by evaluating the change in the signal at the receive antenna 22 between the reference system 40 and the test system 42. Any changes in receive power is attributed to insertion of the current probe 26; so for similar transmit powers, the MCCP effective loss should be given by:

$$P_r - P_r' = M_c + C_t$$

Figure 6A:
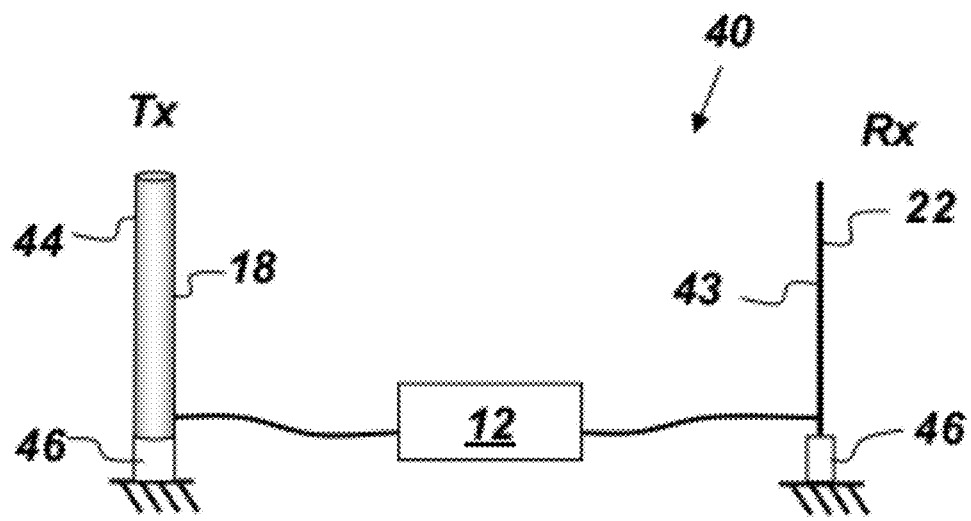
FIGS. 6a-6b are illustrations of a reference two-antenna system and an MCCP test system.

The following scenario is offered as a non-limiting example of the use of method 10. In the following antenna comparisons, three requirements will be used: the structure pole-mast antenna feed-impedance, the reflection loss, and the transmission loss of the MCCP antenna 28. To facilitate the loss estimation, the following example scenario is defined:

(1) In this embodiment, the reference system 40, as depicted in FIG. 6a, is comprised of an approximately 5.5 m (18 ft) traditional monopole whip antenna 43 as the receive antenna 22, and an approximately 5.5 m (18 ft) simulated stub-mast mesh-pole 44 as the transmit monopole antenna 18. Both the whip antenna 43 and the simulated stub-mast mesh-pole antenna 44 are insulated from the ground by insulators 46.

Figure 6B:
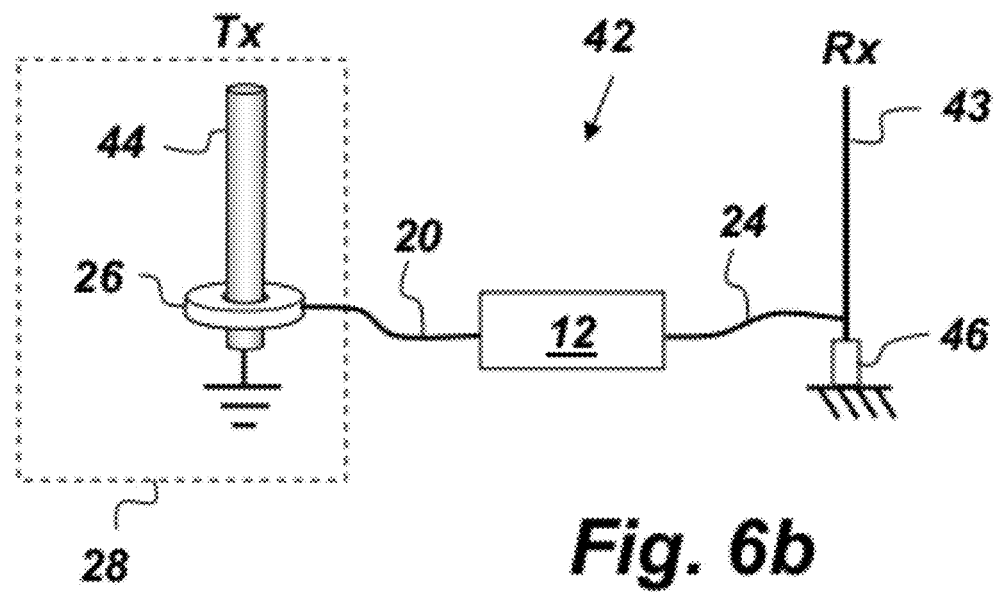

(2) The test system 42, as depicted in the embodiment shown in FIG. 6b, differs from the reference system 40 of FIG. 6a in that a current probe 26 is clamped around the base of the simulated stub-mast mesh-pole 44, which is shorted to the ground plane at the base.

(3) The VNA 12 is coupled to the transmit monopole antenna 18 and the receive antenna 22 by first and second transmission lines 20 and 24 respectively. In this embodiment, the first and second transmission lines are approximately 18.3 meters (60 ft) in length. The receiver power was measured from the input of the 0.91 m (3 ft) feed line attached to the feedpoint of the whip monopole receiving antenna. The feedpoint was about 0.61 m (2 ft) from the insulator base.

In the above-described systems, the VNA 12 measures the S-parameters for the two systems. The effective loss of the MCCP antenna 28 is the reduction in power as the current probe 26 transfers the power from a transmitter to the mast structure (or from the mast structure to the receiver). As detailed above, the reduction is the algebraic difference between the receive power compared to that of the reference system 40. To maintain consistency in interpretation, the power gain (minus attenuation) is estimated for the systems described in the embodiment above. In that embodiment, a negative gain denotes a loss. Across most of the frequency band, insertion of the current probe 26 incurs a loss between 0-15 dB when compared to the reference system 40; except around 3 MHz, there's actually a gain over the reference system 40.

From the above description of the Method for Quantifying the Effective Loss of a Mast Clamp Current Probe (MCCP) Antenna, it is manifest that various techniques may be used for implementing the concepts of method 10 without departing from its scope. The described embodiments are to be considered in all respects as illustrative and not restrictive. It should also be understood that method 10 is not limited to the particular embodiments described herein, but is capable of many embodiments without departing from the scope of the claims.

We claim:

1. A method for quantifying the effective loss of a mast-clamp-current-probe (MCCP) antenna comprising the following steps:
   providing a vector network analyzer (VNA) having first and second ports (Ports 1 and 2 respectively);
   coupling a transmit monopole antenna to Port 1 via a first transmission line;
   coupling a receive antenna to Port 2 via a second transmission line;
   determining the S-parameters of the two coupled antennas;
   calculating the power at the receive antenna ($P_r$);
   converting the transmit antenna to the MCCP antenna by shorting the transmit antenna to ground and clamping a current probe around the transmit antenna;
   determining the S'-parameters of the MCCP antenna and the receive antenna;
   calculating the power at the receive antenna ($P_r'$) when coupled to the MCCP antenna; and
   quantifying the effective loss of the MCCP antenna as the difference $P_r - P_r'$.

2. The method of claim 1 wherein when the impedances of the MCCP and the VNA are similar, it is assumed that the transmit antenna mismatch loss ($S_{11}$) without the current probe attached is similar to the MCCP antenna mismatch loss ($S_{11}'$).

3. The method of claim 1 further comprising the step of using a matching network to match the impedances of the MCCP antenna and the VNA.

4. The method of claim 1, wherein the step of calculating the power at the receive antenna ($P_r$) is accomplished according to the following equation:

$$P_r = P_t - M_t + (G_t - S + G_r) - M_r; \text{ where}$$

$P_t$=transmitted power;
$M_t$=transmit antenna mismatch loss;
$G_t$=transmit antenna gain;
S=space loss;
$G_r$=receive antenna gain; and
$M_r$=receive antenna mismatch loss.

5. The method of claim 4, wherein the step of calculating $P_r'$ is accomplished according to the following equation:

$$P_r' = P_t - (M_c + C_t) - M_t' + (G_t' - S + G_r) - M_r; \text{ where}$$

$M_c$=current probe core mismatch loss;
$C_t$=current probe core loss;
$M_t'$=MCCP antenna mismatch loss; and
$G_t'$=transmit antenna gain with the current probe clamped around the first transmission line.

6. The method of claim 5, wherein the transmit antenna is an approximately 5.5 m (18 ft) mesh-pole antenna.

7. The method of claim 6, wherein the transmit antenna is shorted to a ground plane at its base.

8. The method of claim 6, wherein the receive antenna is an approximately 5.5 m (18 ft) whip antenna.

9. The method of claim 1, wherein the receive antenna is a monopole antenna.

10. The method of claim 1, wherein the receive antenna is a dipole antenna.

* * * * *